United States Patent
Osato et al.

(10) Patent No.: US 7,404,719 B2
(45) Date of Patent: Jul. 29, 2008

(54) CONTACT BLOCK AND ELECTRICAL CONNECTING APPARATUS

(75) Inventors: Eichi Osato, Fuchu (JP); Yoshihito Goto, Fuchu (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/606,705

(22) Filed: Nov. 29, 2006

(65) Prior Publication Data

US 2007/0072479 A1    Mar. 29, 2007

(30) Foreign Application Priority Data

Jul. 5, 2004    (WO) ................. PCT/JP2004/009864

(51) Int. Cl.
*H01R 12/00* (2006.01)

(52) U.S. Cl. .......................... 439/71; 439/66
(58) Field of Classification Search .................. 439/70, 439/71, 266, 331, 330, 72, 66
See application file for complete search history.

(56) References Cited

U.S. PATENT DOCUMENTS

| | | | | |
|---|---|---|---|---|
| 3,026,494 A | * | 3/1962 | Andersen et al. | 439/66 |
| 4,395,084 A | * | 7/1983 | Conrad | 439/331 |
| 4,824,392 A | * | 4/1989 | Billman et al. | 439/331 |
| 5,545,045 A | * | 8/1996 | Wakamatsu | 439/70 |
| 5,574,383 A | * | 11/1996 | Saito et al. | 324/755 |
| 5,764,072 A | * | 6/1998 | Kister | 324/754 |
| 2006/0089015 A1 | * | 4/2006 | Liao et al. | 439/71 |

FOREIGN PATENT DOCUMENTS

| | | |
|---|---|---|
| JP | 3-176676 | 7/1991 |
| JP | 6-58955 | 3/1994 |
| JP | 2003-75503 | 3/2003 |
| JP | 2003-123874 | 4/2003 |

* cited by examiner

*Primary Examiner*—Neil Abrams
*Assistant Examiner*—Phuong Nguyen
(74) *Attorney, Agent, or Firm*—Jeffrey J. King

(57) ABSTRACT

A contact block includes a contact having a pair of contact pieces spaced apart, and an electrically insulating combining block for combining the contact pieces. Each contact piece is provided with a horizontal U-shaped or a horizontal V-shaped intermediate region having a folded end portion and a pair of arm portions vertically spaced apart from the folded end portion; a first tip region extending downward from the tip portion of one of the arm portions; and a second tip region extending upward from the tip portion of the other arm portion. The folded end portions of both contact pieces are buried within the combining block and the remaining parts of both contact pieces are projected from the combining block. Thereby, in a state of being assembled into the electrical connecting apparatus, adjoining contacts are positioned by the combining block, and contacts can be exchanged by exchanging contact blocks.

7 Claims, 8 Drawing Sheets

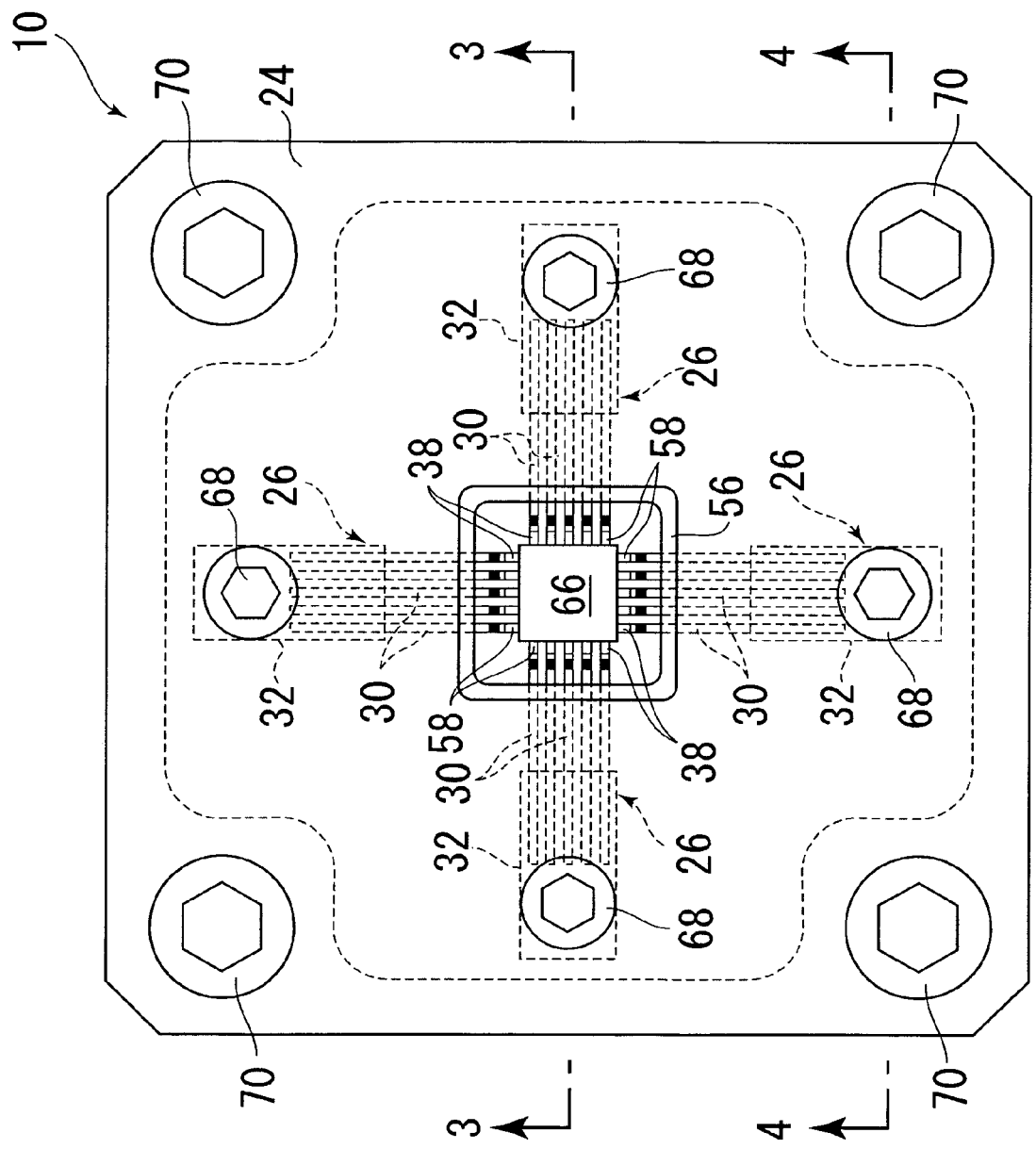
Figure No. 1

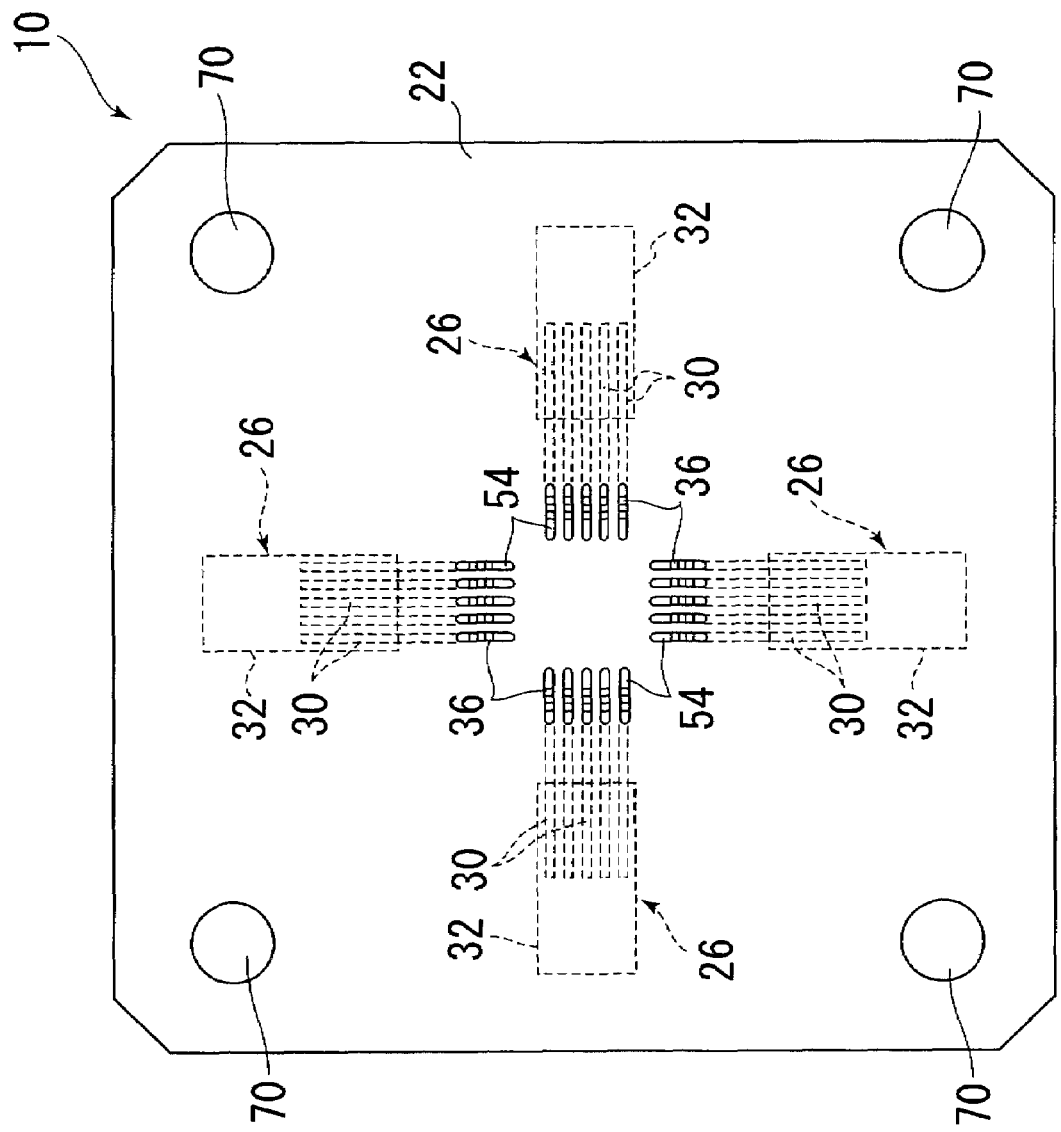
Figure No. 2

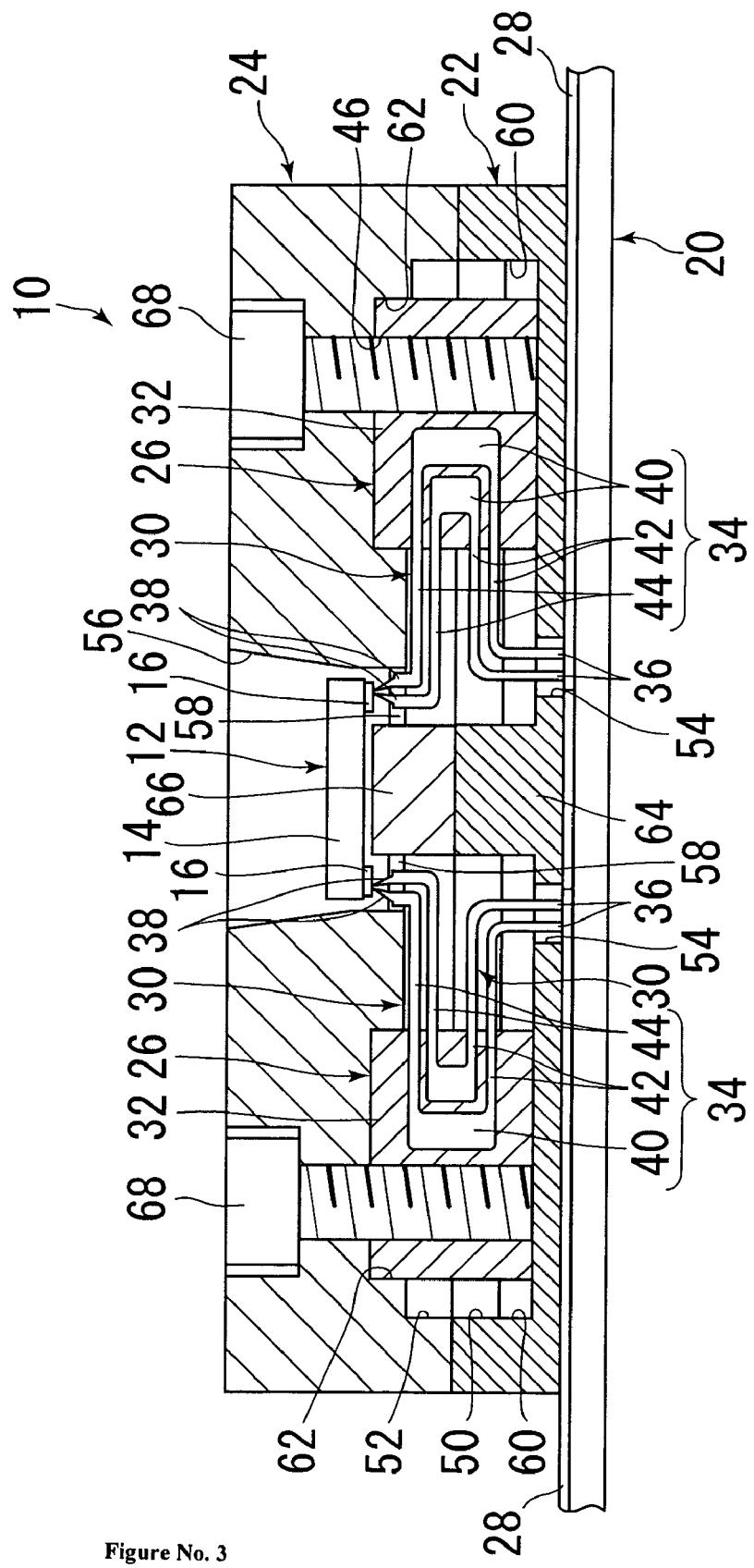
Figure No. 3

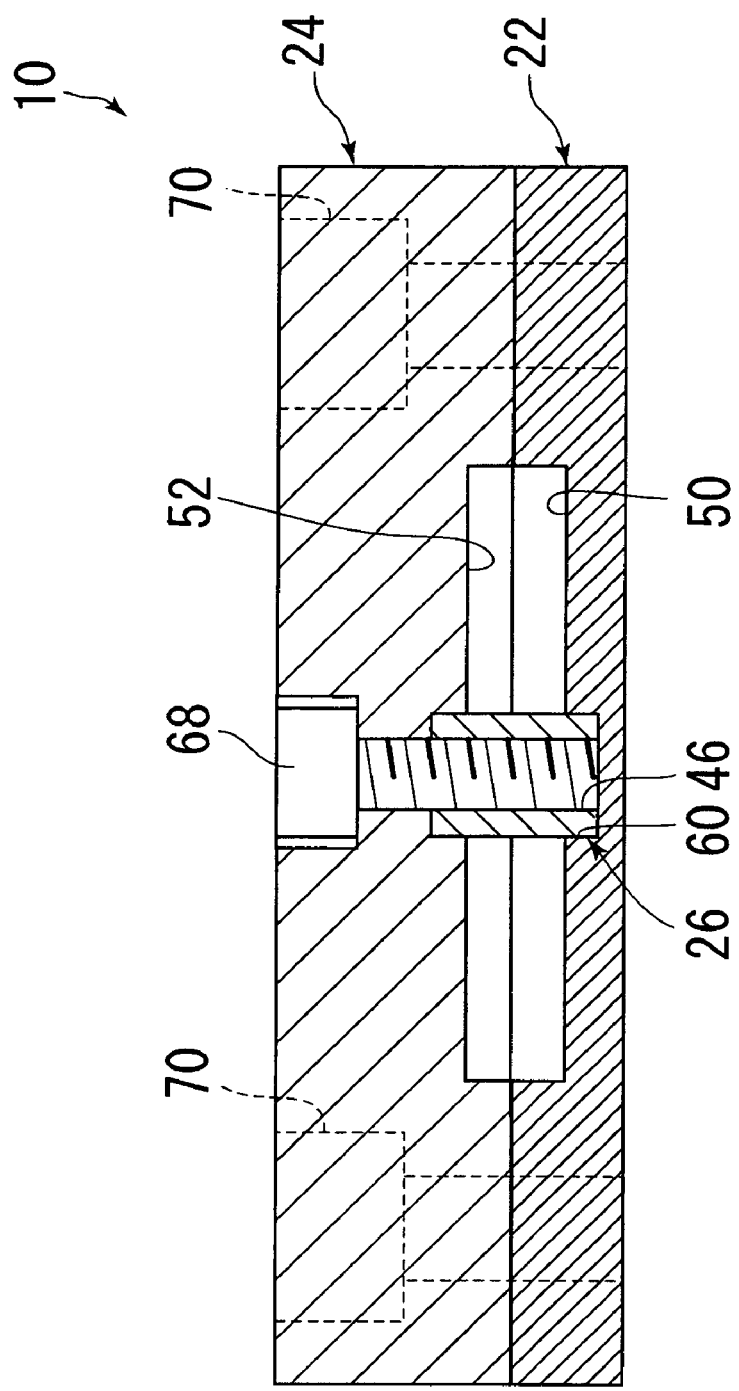
Figure No. 4

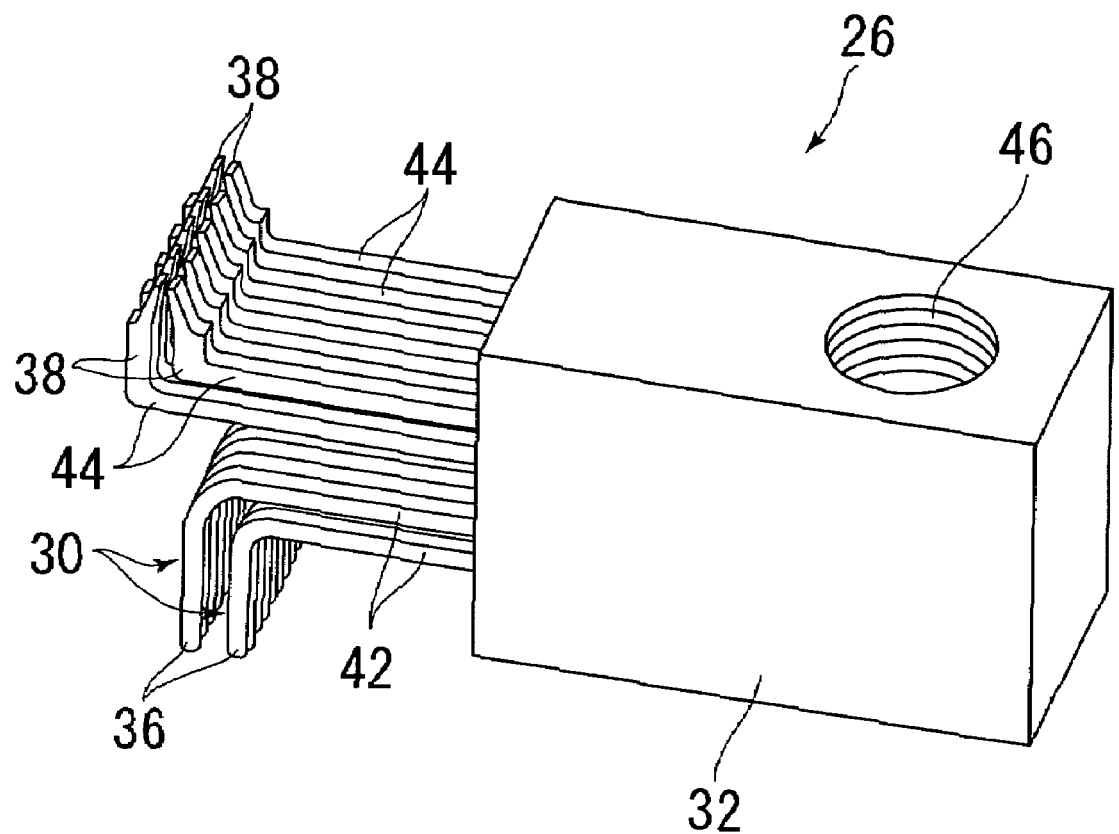
Figure No. 5

Figure No. 6
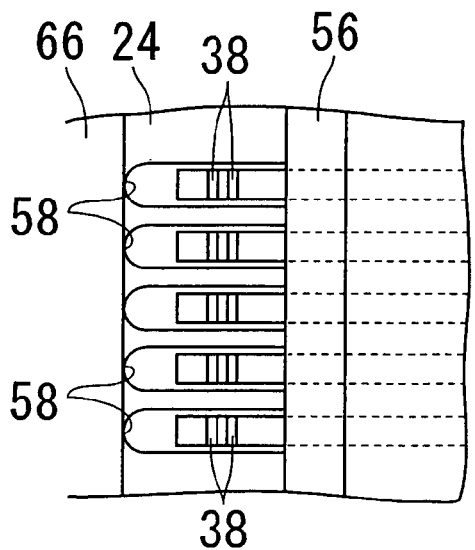
Figure No. 7
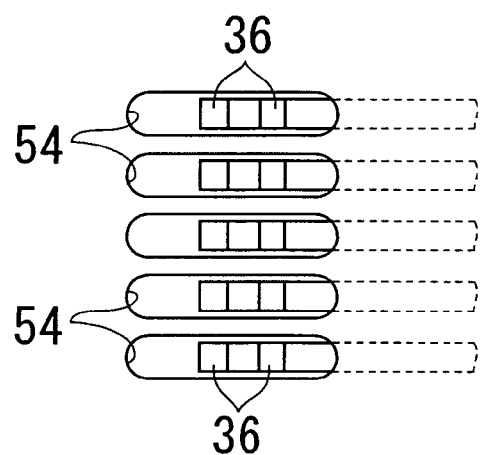
Figure No. 8
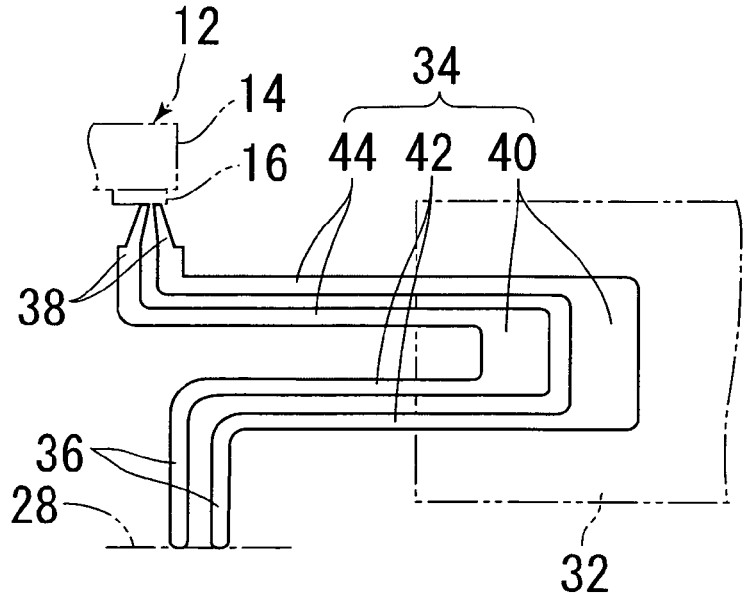

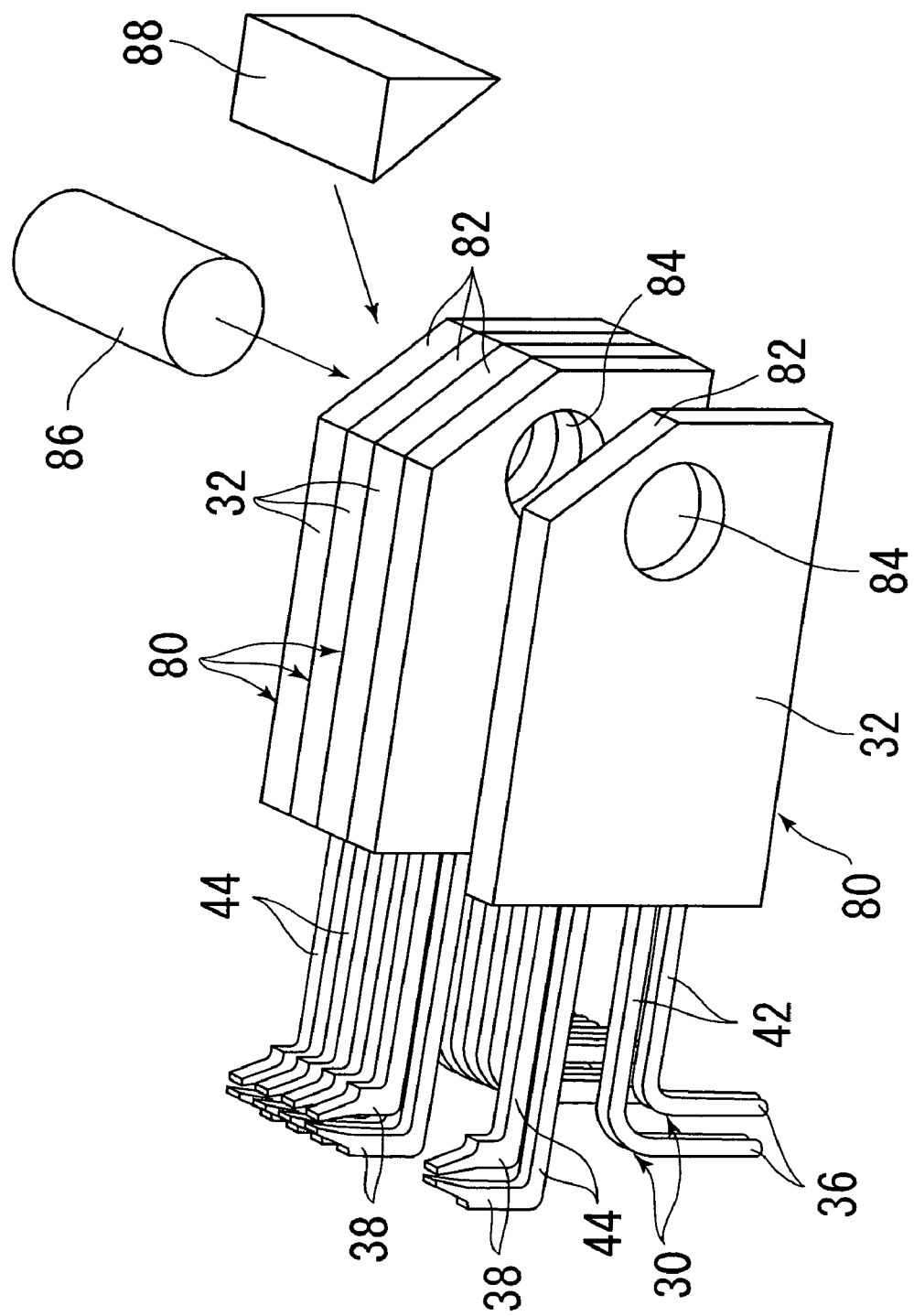
Figure No. 9

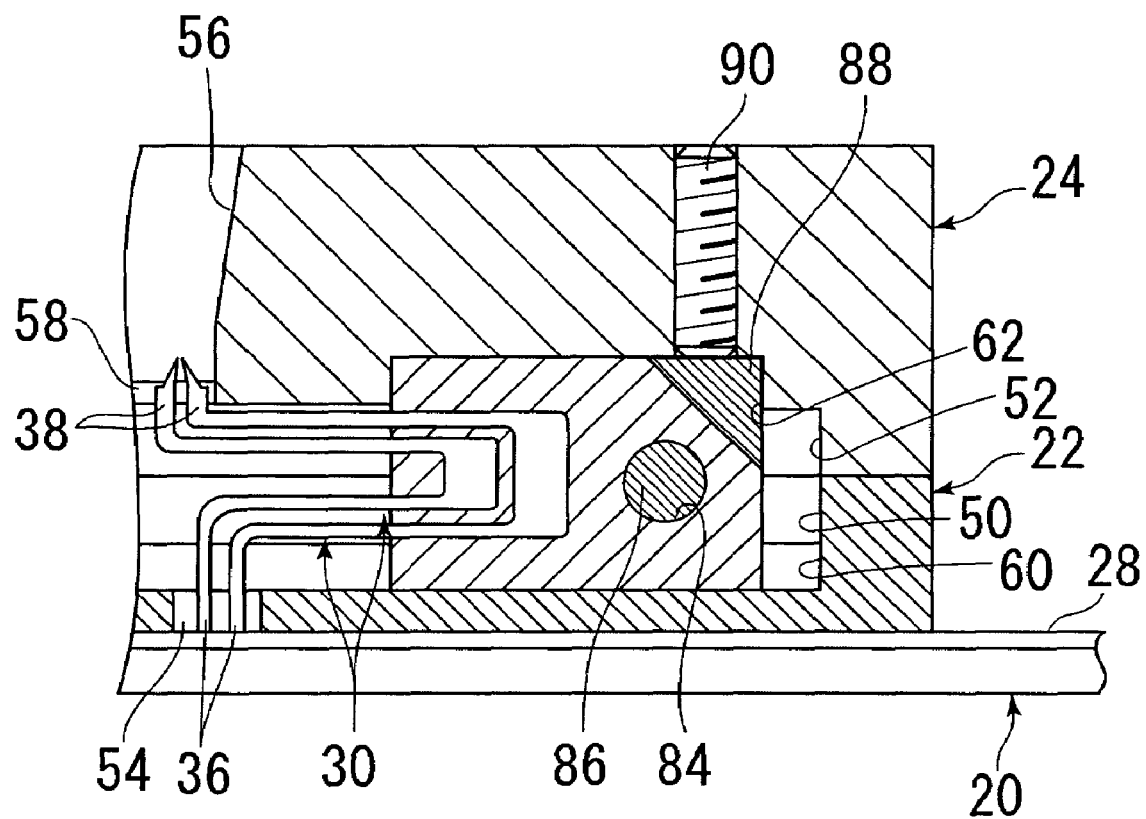
Figure No. 10

CONTACT BLOCK AND ELECTRICAL CONNECTING APPARATUS

CROSS REFERENCE TO RELATED APPLICATIONS

This application claims the priority benefit of PCT/JP2004/009864, filed Jul. 5, 2004, which is incorporated herein by reference.

TECHNICAL FIELD

The present invention relates to a contact block and an electrical connecting apparatus for use in an electrical test of a semiconductor device such as an integrated circuit, and more particularly, to a contact block and an electrical connecting apparatus capable of a Kelvin connection.

BACKGROUND ART

An inspection or a test of a packaged or molded semiconductor device, and more particularly, of an integrated circuit (IC), is generally conducted by using an electrical connecting apparatus such as an inspection socket, that is, a test socket which can mount a semiconductor device removably as an auxiliary means for inspection.

As a type of such an electrical connecting apparatus, can be given one that tests a semiconductor device by a Kelvin connection which improves the accuracy in measurement by canceling circuit resistance within the electrical connecting apparatus or an apparatus for electrical test as well as contact resistance and the like between a contact, a conductive portion and a lead electrode (Japanese Patent Appln. Public Disclosure No. 3-176676 Official Gazette), and one that uses a plurality of contacts curved substantially like a shape of J (Japanese Patent Appln. Public Disclosure No. 2003-123874 Official Gazette).

In the former apparatus, each contact uses a pair of contact pieces (socket leads) having a first and a second contact portions (lead portions), and each second contact portion, when inserted into a corresponding hole of a base plate such as a wiring base plate, is brought into contact with a corresponding conductive portion of the base plate.

In the former apparatus, however, both contact pieces of each contact are independent from each other, making it difficult to correctly position one contact piece relative to the other contact piece and an adjacent contact piece when exchanging the contact pieces. Therefore, it is troublesome to exchange the contact pieces.

In the latter apparatus, each contact has a sandwich-type three-layer structure with a substantially J-shaped thin electrical insulator interposed between a pair of plate-like contact pieces. The contacts are arranged in parallel at intervals in one direction in a cover, with their needle points inserted into a slit formed in the cover, and with the cover assembled into the base plate, the curved portion of a stick-like elastic body such as rubber disposed in the cover is pressed against the corresponding conductive portion of the base plate.

In the latter apparatus, however, the cover must be separated from the base plate when exchanging the contacts. Such separation releases pressing of all the contacts by the elastic body against the conductive portion of the base plate, so that many contacts cannot be prevented from falling off the cover. Consequently, when reassembling the cover into the base plate, the contacts which have fallen off should be rearranged in the cover in parallel at intervals in one direction. Therefore, it is troublesome to exchange the contacts.

SUMMARY OF THE DISCLOSURE OF THE INVENTION

An object of the present invention lies in facilitating to exchange contacts.

A contact block according to the present invention comprises contacts including a pair of contact pieces spaced apart, and an electrically insulated combining block for combining the contact pieces. Each contact piece has: a horizontal U-shaped or horizontal V-shaped intermediate region having folded end portions which are folded back and a pair of arm portions extending in the vertical direction at an interval from the folded end portions; a first tip region extending downward from the tip portion of one of the arm portions; and a second tip region extending upward from the tip portion of the other arm portion. The folded end portions of both contact pieces are buried in the combining block with the remaining parts of both contact pieces projected from the combining block.

In the foregoing contact block, the tips of at least the first tip regions of both contact pieces may be approached to the conductive portion of a device under test so as to be capable of contacting in common.

In the foregoing contact block, a non-buried portion of the intermediate region may be extended from the combining block like a cantilever.

In the foregoing contact block, the intermediate region of one contact piece may be positioned outside the intermediate region of the other contact piece. In this case, the first and second tip regions of the one contact piece may be spaced apart from the first and second tip regions of the other contact piece in the longitudinal direction of the first and second arm portions.

The contact block according to the present invention further includes a plurality of the contacts, which may be combined in a state of being spaced apart in one direction.

The electrical connecting apparatus according to the present invention comprises: at least one contact block such as mentioned above; a first and a second plate-like members overlapping each other to form a space to accommodate the contact blocks; and an attachment for attaching the contact blocks to the first or the second plate-like member. The first plate-like member is provided with a plurality of first long holes which receive both first tip regions of the contacts are disposed at intervals in a direction intersecting the longitudinal direction of the arm portion and extend in the longitudinal direction of the arm portions. The second plate-like member is provided with an opening for receiving a device under test, and a plurality of second long holes which receive the second tip regions of the contacts are disposed at intervals in a direction intersecting the longitudinal direction of the arm portions and extend in the longitudinal direction of the arm portion.

The attachment may be extended through the combining block of the plurality of contact blocks.

The foregoing electrical connecting apparatus can further comprise a wiring base plate having a conductive portion with which the first and second tip regions of the contact are brought into contact and with which the first and second plate-like members are combined.

Effect of the Invention

When a pair of the contact pieces having: a horizontal U-shaped or a horizontal V-shaped intermediate region including a folded end portion; a pair of arm portions spaced apart in the vertical direction from the folded end portion; a first tip region extending upward from the tip portion of one of the arm portions; and a second tip region extending downward from the tip portion of the other of the arm portions are used, and when the contact block in which at least the folded end portions of both contact pieces are buried and the remaining part of which are projected from the combining block is used, adjoining contacts are positioned by the combining block in a state of being assembled into the electrical connecting apparatus. Consequently, for exchanging contacts, it suffices to exchange contact blocks, thereby facilitating the work to exchange the contacts.

BRIEF DESCRIPTION OF THE DRAWINGS

FIG. 1 is a plan view of one embodiment of the electrical connecting apparatus according to the present invention, shown with the wiring base plate removed.

FIG. 2 is a bottom view of the electrical connecting apparatus in FIG. 1, shown with the wiring base plate removed.

FIG. 3 is an enlarged section obtained along the line 3-3 in FIG. 1.

FIG. 4 is a partly enlarged section obtained along the line 4-4 in FIG. 1.

FIG. 5 is a perspective view showing one embodiment of the contact block according to the present invention.

FIG. 6 is an enlarged plan view of the neighborhood of the long holes in the first plate-like member.

FIG. 7 is an enlarged bottom view of the neighborhood of the long holes in the second plate-like member.

FIG. 8 is a view showing a state of electrical connection of each contact.

FIG. 9 is a perspective view showing another embodiment of the contact block and the combining block.

FIG. 10 is a vertical cross section showing a part of the electrical connecting apparatus using the contact block and the combining block shown in FIG. 8.

EXPLANATION OF REFERENCE NUMERALS electrical connecting apparatus
device under test
electrode
wiring base plate
22, 24 first and second plate-like members
26, 80 contact blocks
wiring
contact piece
combining block
intermediate region
36, 38 first and second tip regions
folded end portion
42, 44 arm portions
50, 52 first and second spaces
54, 58 first and second long holes
opening
60, 62 first and second recesses
68, 70 bolt
slope
hole
pin
pad member
set screw

THE BEST MODE FOR WORKING THE INVENTION

Referring to FIGS. 1-7, the electrical connecting apparatus 10 is used for an electrical test of a semiconductor device as a device under test 12. The device under test 12 includes a plate-like body 14 packaged or molded in a rectangular plane shape, and a plurality of electrodes 16 formed on the underside of the body 14.

The electrodes 16 are divided into four electrode groups individually corresponding to the four sides of the rectangle, in which the electrodes are arranged at intervals in the direction of the corresponding side. Each electrode 16 is positioned at a point inside the corresponding side and is shaped like a plate extending in a direction orthogonal to the corresponding side.

The connecting apparatus 10 comprises: a wiring base plate 20 which acts as a base plate; a first plate-like member 22 overlapping the wiring plate 20; a second plate-like member 24 overlapping the first plate-like member 22; and a plurality of contact blocks 26 arranged on the first and second plate-like members 22 and 24.

The base plate 20 has a plurality of wirings 28. Those wirings 28 are divided into four wiring groups made to correspond in one-to-one relationship to the electrode groups of the device under test 12 (i.e., the four sides of the rectangle). The wirings 28 of each wiring group extend from the center of the wiring base plate 20 toward the corresponding side at intervals in a direction perpendicular to the corresponding side.

In the illustrated example, each electrode 16 acts as the first conductive portion, and each wiring 28 acts as the second conductive portion.

In the illustrated example, the four contact blocks 26 made to correspond in one-to-one relationship to combinations of the electrode groups and the wiring groups of the device under test 12 are arranged at equal angular intervals around the center of the first and second plate-like members 22 and 24.

Each contact block 26 includes a plurality of pairs of contact pieces 30 and an electrically insulated combining block 32 for combining both contact pieces 30. Both contact pieces 30 as paired have similar shapes and act in cooperation as one contact.

Each contact block 26 has a rectangular wave-like pulse form which has a horizontal U-shaped (or a horizontal V-shaped) intermediate region 34 having a pair of tip portions, a first tip region 36 extending downward from one tip portion of the intermediate region 34, and a second tip region 38 extending upward from the other tip portion of the intermediate region 34.

In the intermediate region 34, a folded region is made the folded end portion 40, and a pair of regions extending in parallel at a vertical interval from the folded end portion 40 are made the arm portions 42 and 44.

The first tip region 36 extends downward from the tip portion of one arm portion 42, while the second tip region 38 extends upward from the tip portion of the other arm portion 44.

The folded end portion 40 of the contact piece 30 and the base end portions of the arm portions 42 and 44 are buried in the combining block 32. The remaining part of the contact piece 30 is projected from the combining block 32 and acts as cantilever-like upper needle region and lower needle region.

Both contact pieces 30 of each contact are in the same positions in the direction orthogonal to the longitudinal direction of the arm portions 42 and 44, and are maintained by the combining block 32 such that the intermediate region 34 of one contact piece 30 comes outside the intermediate region 34 of the other contact piece 30, and are spaced apart in the longitudinal direction of the arm portions 42, 44 as a whole.

The tips of both tip regions 38 of each contact are approached to be able to contact in common with the electrode 16 of the device under test 12. The tip portion s of both second tip regions 38 of each contact is formed like a wedge whose thickness dimension becomes smaller toward the tip side, so as to extend in the direction orthogonal to the longitudinal direction of the arm portion 44 within a horizontal plane.

On the other hand, the tips of both first tip regions 36 of each contact are enabled to contact in common with the wirings 28 of the wiring base plate 20 and formed as an arc-shaped face convex downward.

The contact pieces 30 of each contact block 26 are combined by a combining block 32 such that the height positions of their first tip regions 36 as well as the height positions of their second tip regions 38 become the same, and that the tip positions of the first tip regions 36 in the longitudinal direction of the arm portions 42, 44 as well as the tip positions of the second tip regions 38 become the same.

The combining block 32 is shaped like a cube by forming with synthetic resin, so as to include the folded end portion 40 and the base end portions of the arm portions 42 and 44 of the contact piece 30. The combining block 32 has a screw hole 46 penetrating in the vertical direction.

The first and second plate-like members 22 and 24 are made of an electrically insulating material such as synthetic resin to be shaped like square plane of the same size.

The first plate-like member 22 has a first space 50 opening upward, while the second plate-like member 24 has a second space 52 opening downward. The first and second spaces 50 and 52 act as spaces for accommodating the contact blocks 26.

The first plate-like member 22 is also provided with a plurality of first long holes 54 receiving both first tip regions 36 of the contact piece at each contact block 26. Each long hole 54 is communicated to the first space 50 and a lower space of the first plate-like member 22.

The first long holes 54 are disposed at intervals in the direction orthogonal to the longitudinal direction of the arm portions 42, 44 and extend in the longitudinal direction of the arm portions 42, 44 at each group of the corresponding contact blocks 26.

The second plate-like members 24 has an opening 56 opening upward so as to receive the device under test 12, and a plurality of second long holes 58 which receive both second tip regions 38 of the contact at each contact block 26. Each second long hole 58 is communicated to the second space 52 and the opening 56.

The second long holes 56 are disposed at intervals in the direction orthogonal to the longitudinal direction of the arm portions 42, 44 and extend in the longitudinal direction of the arm portions 42, 44 at each group of the corresponding contact blocks 26. The upper half part of the opening 56 is made an inclined plane so as to guide the device under test 12 correctly to the contact.

The first plate-like member 22 is further provided with a plurality of first recesses 60 into which the combining block 32 of the corresponding contact block 26 made to individually correspond to the contact block 26 is fitted. Each first recess 60 opens in the space 50 and receives the lower portion of the combining block 32 of the corresponding contact block 26.

The second plate-like member 24 is further provided with a plurality of second recesses 62 into which the combining block 32 of the corresponding contact block 26 made to individually correspond to the contact block 26 is fitted. Each second recess 62 opens in the space 52 to be opposed by the first recess 60 and receives the upper portion of the combining block 32 of the corresponding contact block 26.

In the first and second plate-like members 22 and 24, inside portions 64 and 66 where the first and second long holes 54 and 58 are located are integrated with portions outside the first and second long holes 54 and 58 by the portion between the adjoining first long holes 54 and the portion between the adjoining second long holes 58.

The connecting apparatus 10 can be assembled in the following manner.

In the first place, the combining block 32 of each contact block 26 is fitted into the recess 60 of the second plate-like member 24, and each contact block 26 is attached to the second plate-like member 24 by a bolt 68 which penetrates the second plate-like member 24 and screwed into the screw hole 46 of the combining block 32.

Then, the first and second plate-like members 22 and 24, overlapping each other, are combined with each other by a bolt 70 which penetrates the second plate-like member 24 and is screwed into the first plate-like member 22.

Next, the first and second plate-like members 22 and 24 are mounted on the wiring base plate 20 such that the first plate-like member 22 comes below, and the first and second plate-like members 22 and 24 are attached to the wiring base plate 20 by means of a suitable attachment such as a bolt.

In place of using the above-mentioned bolt 70 and attachment, the first and second plate-like members 22 and 24 may be attached to each other and to the wiring base plate 20 with a bolt penetrating the first and second plate-like members 22 and 24 and screwed into the wiring base plate 20.

In the electrical connecting apparatus 10 assembled as mentioned above, both first tip regions 36 of each contact have their tips brought into contact with the wiring 28 in common. The second tip region 38 of each contact is projected slightly upward from the second long hole 58.

In the electrical connecting apparatus 10, since the lower tip region of each contact is supported on the combining block 32 like a cantilever, if the first and second plate-like members 22 and 24 are attached to the wiring base plate 20 with both first tip regions 36 of each contact projected slightly downward from the first long hole 54, the lower tip region of each contact is elastically deformed, and the first tip region 36 of each contact is surely pressed against the wiring 28. For this reason, even if there is a little difference in height position of the first tip regions 36, each first tip region 36 can be surely connected to the wiring 28.

The device under test 12 is disposed in the opening 56, as shown in FIGS. 3 and 8, with the electrode 16 pressed against the second tip region 38, and electrified in that state to conduct an electrical test of the device under test 12.

Since both first tip regions 36 and both second tip regions 38 are connected to the wiring 28 and electrode 16 in common, such an electrical test is conducted in a state of Kelvin connection.

In the electrical connecting apparatus 10, since the upper tip region of each contact is supported on the combining block 32 like a cantilever, the upper tip regions of each contact are elastically deformed by pressing the electrode 16 against the second tip regions 38, so that the second tip regions 38 of each contact are surely pressed against the electrode 16. Consequently, even if there is a little difference in height position of the second tip regions 38, each second tip region 38 is surely connected to the electrode 16.

In a contact block using contact pieces having a shape and a structure such as mentioned above, adjoining contacts are positioned by the combining block 32. Consequently, for exchanging the contacts, it suffices to exchange the contact blocks 26, thereby facilitating the work to exchange the contacts.

In the electrical connecting apparatus 10, in case there are many electrodes 16 arranged on each side of the rectangle, a plurality of contact blocks 26 may be arranged in the direction of the arrangement of the contacts.

Also, in place of arranging a plurality of contacts in each contact block 26, a plurality of contact blocks 80 with one contact piece may be arranged in the direction of the arrangement of the contacts.

In the embodiment shown in FIGS. 9 and 10, the combining blocks 32 of each contact block 80 are made plate-like and the rear end portions are chamfered inclined planes 82, and have holes 84 penetrating the combining blocks 32 in the thickness direction.

For assembling into the first and second plate-like members 22 and 24, a round bar-like pin 86, a pole-like pad member 88 having a right-triangle-shaped section, and at least one set screw 90 are used. The pin 86, the pad member 88 and the set screw 90 may be made of metal.

The contact blocks 80, combined with each other as mentioned below, are attached to the first and second plate-like members 22 and 24.

In the first place, a plurality of contact blocks 80 are overlapped in the thickness direction of the combining blocks 32 such that the holes 84 align, and the combining pin 86 is passed through the holes 84. Thereby, the contact blocks 80 are combined with each other to form a contact block assembly.

Next, in a state of the contact block assembly, the contact blocks 80 are arranged in the first and second plate-like members 22 and 24 such that the lower portions and upper portions of the combining blocks 32 are respectively received in the first and second recesses 60 and 62. The pad member 88 is disposed in the second recess 62 with its inclined plane brought into contact with the inclined plane 82.

Then, the first and second plate-like members 22 and 24 are slackly combined to an extent that the contact block assembly can displace relative to the first and second plate-like members 22 and 24.

Then, the set screw 90 is screwed into the second plate-like member 24 until the contact block assembly becomes incapable of displacing relative to the first and second plate-like members 22 and 24. Thereby, the contact block 80 is positioned relative to the first and second plate-like members 22 and 24.

Thereafter, the first and second plate-like members 22 and 24 are firmly combined.

INDUSTRIAL APPLICABILITY

It is possible to use the electrical connecting apparatus 10 in an upside-down state or in an inclined state such that the longitudinal direction of the first and second tip regions 36 and 38 are slanted.

The present invention is not limited to the above embodiments but can be variously modified without departing from its purport.

What is claimed:

1. An electrical connecting apparatus comprising: a plurality of contact blocks; a first and a second plate-like members overlapping each other to form a space for accommodating said contact block; and an attachment for attaching said contact block to said first or second plate-like member;

said contact including a pair of contact pieces spaced from each other, and an electrically insulating combining block for combining said contact pieces, wherein each contact piece is provided with: a horizontal U-shaped or a horizontal V-shaped intermediate region having a folded end portion which is folded back and a pair of arm portions extending at a vertical interval from said folded end portion; a first tip region extending downward from the tip portion of one of said arm portions; and a second tip region extending upward from the tip portion of the other arm portion;

wherein said folded end portions of both contact pieces are buried in said combining block, and the remaining parts of both contact pieces are projected from said combining block, wherein said first plate-like member is provided with a plurality of first long holes which receive both first tip regions of said contact are disposed at intervals in a direction intersecting the longitudinal direction of said arm portion and extend in the longitudinal direction of said arm portion; and wherein said second plate-like member is provided with an opening for receiving a device under test; and a plurality of second long holes in which said second tip region of said contact is received and which are disposed at intervals in a direction intersecting the longitudinal direction of said arm portion and extend in the longitudinal direction of said arm portion.

2. A contact block claimed in claim 1, wherein the tips of at least said second tip regions of both contact pieces are close to the conductive portion of a device under test in common so as to be able to contact.

3. A contact block claimed in either claim 1, wherein a non-buried part of said intermediate region extends from said combining block like a cantilever.

4. A contact block claimed in claim 1, wherein said intermediate region of one of the contact pieces is positioned outside said intermediate region of the other contact piece; and wherein said first and second tip regions of one of the contact pieces are spaced apart from said first and second tip regions of the other contact piece in the longitudinal direction of said first and second arm portions.

5. An electrical connecting apparatus claimed in claim 1, wherein said attachment extends through said combining block of said contact blocks.

6. An electrical connecting apparatus claimed in any one of claims 1 through 5, further comprising a wiring base plate having a conductive portion with which said first tip region of said contact is brought into contact and in which said first and second plate-like members are combined.

7. An electrical connecting apparatus comprising a contact block comprising a plurality of contacts including a pair of contact pieces spaced from each other, and an electrically insulating combining block for combining said contact pieces, wherein said combining block combines said contacts such that said contacts are spaced apart in one direction, wherein each contact piece is provided with: a horizontal U-shaped or a horizontal V-shaped intermediate region having a folded end portion which is folded back and a pair of arm portions extending at a vertical interval from said folded end portion; a first tip region extending downward from the tip portion of one of said arm portions; and a second tip region extending upward from the tip portion of the other arm portion, and wherein said folded end portions of both contact pieces are buried in said combining block, and the remaining parts of both contact pieces are projected from said combining block;

first and a second plate-like members overlapping each other and forming a space for accommodating the contact block;

an attachment for attaching said contact block to said first or second plate-like member, wherein said first plate-like member is provided with a plurality of long holes receiving both first tip regions of said contact, said long holes being disposed at intervals in a direction intersecting the longitudinal direction of said arm portion and extending in the longitudinal direction of said arm portion, and wherein said second plate-like member is provided with an opening for receiving a device under test, and a plurality of second long holes in which said second tip regions of said contacts are received, said second long holes being disposed at intervals in a direction interesting the longitudinal direction of said arm portion and extending in the longitudinal direction of said arm portion.

* * * * *